(12) United States Patent
Watanabe et al.

(10) Patent No.: US 6,879,278 B2
(45) Date of Patent: Apr. 12, 2005

(54) A/D CONVERSION METHOD AND APPARATUS

(75) Inventors: Takamoto Watanabe, Nagoya (JP); Takayuki Torigoe, Nagoya (JP); Koji Adumi, Nagoya (JP); Hidetoshi Yamauchi, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/854,297

(22) Filed: May 26, 2004

(65) Prior Publication Data

US 2004/0239546 A1 Dec. 2, 2004

(30) Foreign Application Priority Data

May 29, 2003 (JP) ........................................ 2003-153107

(51) Int. Cl.⁷ ................................................ H03M 1/12
(52) U.S. Cl. ...................................................... 341/155
(58) Field of Search ................................ 341/155, 158, 341/156

(56) References Cited

U.S. PATENT DOCUMENTS 5,055,845 A * 10/1991 Ridkosil ..................... 341/155

5,396,247 A 3/1995 Watanabe et al.
2003/0201927 A1 10/2003 Watanabe et al.

FOREIGN PATENT DOCUMENTS

JP  5-259907  10/1993

* cited by examiner

*Primary Examiner*—Brian Young
(74) *Attorney, Agent, or Firm*—Harness, Dickey & Pierce, PLC

(57) ABSTRACT

An A/D converter for driving a plurality of delay units forming a pulse delay circuit by an analog input signal Vin and digitalizing the number of delay units through which a pulse signal passes in the pulse delay circuit at predetermined timings, provided with a plurality of pulse position digitalizing units used for A/D conversion and inputting delay pulses from the delay units of the pulse delay circuit to the pulse position digitalizing units through an inverter group comprised of inverters with different inversion levels (switching threshold level) by different input timings. The digital data obtained by the pulse position digitalizing units are added by an adder.

16 Claims, 13 Drawing Sheets

TO PULSE SELECTOR 24

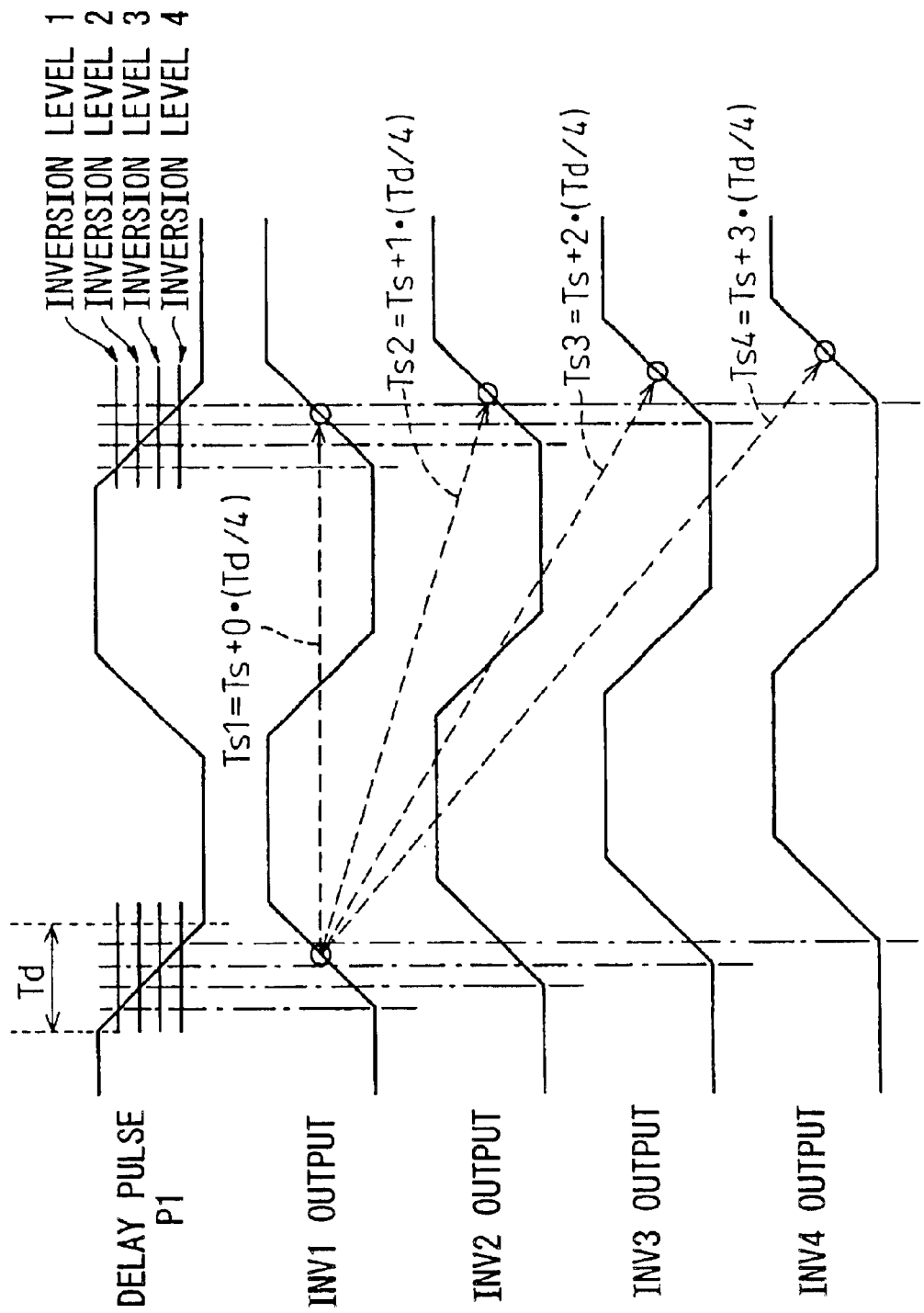

A/D CONVERSION METHOD AND APPARATUS

BACKGROUND OF THE INVENTION

1. Field of the Invention

The present invention relates to an A/D conversion method and apparatus for converting an analog input signal to digital data using a pulse delay circuit comprised of a plurality of series-connected delay units outputting a pulse signal with a delay.

2. Description of the Related Art

Known in the past has been, as an A/D converter of a simple configuration giving high resolution digital values, an A/D converter supplying an analog input signal for A/D conversion as power source voltage to a pulse delay circuit comprised of a plurality of delay units comprised of various gate circuits connected in a ring, inputting a pulse signal for propagation to cause the pulse signal to circulate in the pulse delay circuit by a speed corresponding to the delay time of the delay units, and counting the number of delay units through which the pulse signal passes in the pulse delay circuit within a predetermined sampling time during circulation of the pulse, and thereby converting the analog input signal to digital data (for example, see Japanese Unexamined Patent Publication (Kokai) No. 5-259907).

This A/D converter utilizes the fact that the delay time of the delay units changes in accordance with the power source voltage. It supplies the analog input signal as a power source voltage to the delay units forming the pulse delay circuit to thereby modulate the speed of movement of the pulse signal circulating in the pulse delay circuit by the analog input signal, measures the speed of movement by counting the number of delay units through which the pulse signal passes in a predetermined sampling time, and outputs the results of measurement (count) as digital data after the A/D conversion.

Further, according to this A/D converter, it is possible to set the voltage resolution of the digital data obtained in accordance with the delay time per delay unit forming the pulse delay circuit and the sampling time at the time of A/D conversion and possible to raise the voltage resolution of the digital data by either shortening the delay time per delay unit or lengthening the sampling time, so it is possible to provide an A/D converter able to realize high precision A/D conversion by a simple configuration and inexpensive cost.

Summarizing the problems to be solved by the invention, in the above A/D converter, the delay time per delay unit forming the pulse delay circuit is determined by the level of miniaturization (CMOS design rule) of the device forming the delay unit (inverter or other gate circuit), so there are limits to shortening the delay time per delay unit of the pulse delay circuit for raising the resolution of the A/D conversion.

Further, in the above A/D converter, if increasing the sampling time at the time of A/D conversion for raising the resolution of the A/D conversion, in a system requiring high speed A/D conversion such as an A/D conversion speed of several MHz to several tens of MHz, the speed ends up becoming insufficient and the requirements can no longer be met.

That is, the A/D converter is a so-called integration type A/D converter. The obtained digital value is obtained by integrating the fluctuating component of the analog input signal by the sampling time of the A/D conversion, so if the sampling time of the A/D conversion is increased to raise the resolution of the A/D conversion, it is not possible to reflect any fluctuation in the analog input signal in the obtained digital value and utilization in a system requiring high speed A/D conversion ends up becoming impossible.

Therefore, conventionally, in an apparatus requiring speed and precision of A/D conversion, a successive comparison type A/D converter of a higher speed than the above integration type A/D converter or a parallel type (also called "flash" type) A/D converter enabling instantaneous A/D conversion has been used.

However, to raise the resolution of the A/D conversion in such a successive comparison type or parallel type A/D converter, it is necessary to generate a large number of reference voltages corresponding to the resolution, so there was the problem that in an apparatus requiring speed and precision of A/D conversion, it was only possible to use a complicatedly configured, expensive A/D converter and higher costs of the apparatus as a whole were invited.

SUMMARY OF THE INVENTION

An object of the present invention is to provide an A/D conversion method and A/D converter able to convert an analog signal to a digital value at a high speed and high precision using an A/D converter able to be realized by a simple configuration at a low cost.

According to a first aspect of the invention, there is provided an A/D conversion method comprising modulating by an analog input signal the delay time of delay units in a pulse delay circuit comprised of a plurality of series-connected delay units outputting a pulse signal with a delay; inputting a pulse signal to the pulse delay circuit so as to propagate a pulse signal through the pulse delay circuit, latching output signals from the delay units forming the pulse delay circuit at predetermined timings, and generating digital data expressing reached positions of the pulse signal in the pulse delay circuit based on the levels of the latched signals so as to digitalize the analog input signal, characterized by latching the output signals from the delay units forming the pulse delay circuit and generating the digital data simultaneously using a plurality of pulse position digitalizing means, shifting the input timings of the output signals from the delay units by a time shorter than a delay time of the delay units for each of the pulse position digitalizing means, and adding digital data obtained by the pulse position digitalizing means.

That is, in the A/D conversion method of the first aspect, the analog input signal is converted to digital data (A/D conversion) using a pulse delay circuit in the same way as the above conventional A/D converter. This A/D conversion is performed simultaneously using a plurality of pulse position digitalizing means. By adding the digital data obtained by the pulse position digitalizing means, digital data is obtained as the result of A/D conversion.

Therefore, if designating the number of pulse position digitalizing means as m and designating the number of bits of the digital data obtained by the pulse position digitalizing means as n, the number of bits of the digital data obtained by the A/D conversion method of the present invention becomes "n+$\log_2$ m". Further, since the input timings of the output signals from the delay units forming the pulse delay circuit to the pulse position digitalizing means are shifted by exactly the time ΔT shorter than the delay time of the delay units, the positions of the output signals where the signal levels change in the output signals from the delay units latched by the pulse position digitalizing means (that is, the reached positions of the pulse signal in the pulse delay circuit) fluctuate due to the shift ΔT of the input timings of the output signals. The digital data generated by the pulse position digitalizing means also fluctuates.

Therefore, the digital data finally obtained by adding the digital data generated by the pulse position digitalizing means (that is, the results of A/D conversion) becomes the sum of the digital data obtained by digitalization by timings different by exactly the time ΔT shorter than the delay time of the delay units. The resolution of the digital data finally obtained can be raised compared with the above conventional A/D conversion method.

Further, in the first aspect, rather than executing the digitalization operation for digitalizing the positions of the pulse signal in the pulse delay circuit continuously a plurality of times, a plurality of digitalization operations are executed simultaneously, so the time required for A/D conversion does not become longer than the conventional method and higher precision A/D conversion becomes possible in the same time as in the conventional method. Further, if the voltage resolution of the digital data obtained by addition can be the same as in the past, the time required for A/D conversion can be shortened.

Further, if realizing the apparatus for working the first aspect, it becomes possible to realize an A/D converter able to convert an analog input signal to a digital format at a high speed with a high precision without shortening the delay time per delay unit or increasing the sampling time. Further, in this A/D converter, it is not necessary to generate a reference voltage for comparison with the analog input signal such as with a successive comparison type or parallel type A/D converter, so this hardware configuration can be realized simply and inexpensively. Consequently, by using the method of the present invention, it becomes possible to realize more inexpensively an apparatus where speed and precision of A/D conversion are required.

Here, the shift ΔT of the input timing of the output signal of each of the pulse position digitalizing means, as shown in the second aspect of the invention, is preferably set to a time (Td/m) obtained by dividing the delay time (Td) of the delay units by the number (m) of the pulse position digitalizing means. That is, by doing this, the digital data generated by the pulse position digitalizing means become values expressing the reached positions of the pulse signal in the pulse delay circuit at times shifted from each other by exactly the time (Td/m) obtained by dividing the delay time (Td) of the delay units by the number (m) of the pulse position digitalizing means. The resolution (in other words, a voltage value corresponding to the least significant bit (LSB) of the digital data) is shifted by exactly 1/m the resolution determined by the delay time (Td) of the delay units delaying the pulse signal in the pulse delay circuit.

Therefore, the voltage value per bit of the digital data finally obtained by the A/D conversion method of the second aspect of the invention becomes 1/m the voltage value per bit of digital data generated by one pulse position digitalizing means. It becomes possible to convert the voltage value of the analog input signal to digital data more accurately.

Next, to shift the input timings of the output signal from the delay unit for each of the pulse position digitalizing means, it is sufficient to delay the output signal input to the pulse position digitalizing means, but for this it is necessary to shorten the delay time of the output signals from the delay time of the delay units forming the pulse delay circuit.

Further, normally inverters or other gate devices are used for the delay units, so to shift the input timings of the output signals from the delay units for each of the pulse position digitalizing means, like in the third aspect of the invention, it is sufficient to utilize inverters provided on input paths of the output signals from the delay units in the pulse delay circuit to the pulse position digitalizing means and set the inversion levels of the inverters (in other words, the switching levels of the inverters) to levels different for each of the pulse position digitalizing means.

Note that for the inverters for the delay of the output signals, it is possible to use inverters separately provided at the input passages from the delay units to the pulse position digitalizing meanss or possible to utilize inverters provided at the pulse position digitalizing meanss (or inverters forming the latch circuit for latching the output signals).

Next, as in the third aspect of the invention, when using inverters to shift the input timings of the output signals to the pulse position digitalizing means, if setting the drive voltages of the inverters to a constant voltage different from the analog input voltage, it is not possible to set the shift ΔT of the input timings of the output signals for each of the pulse position digitalizing means corresponding to the delay time Td of the delay units forming the pulse delay circuit.

That is, the delay time of the delay units forming the pulse delay circuit is modulated by the analog input signal. If the voltage value of the analog input signal changes, the delay time of the delay units also changes, but if setting the drive voltages of the inverters for delaying the output signals to a constant voltage different from the analog input voltage, the inversion levels of the inverters end up becoming constant levels, so it is not possible to change the shift ΔT of the input timings of the output signals of each of the pulse position digitalizing means in accordance with the delay time Td of the delay units. In particular, in the second aspect of the invention, it ends up becoming difficult to set the input timings of the output signals for each of the pulse position digitalizing means to timings different by Td/m units to improve the precision of A/D conversion of the analog input signal.

Therefore, it is preferable to make the drive voltage of the inverters the analog input voltage as in the fourth aspect of the present invention. That is, by doing this, it becomes possible to change the inversion levels of the inverters (in other words, the delay times of the output signals by the inverters) in accordance with the delay time of the delay units forming the pulse delay circuit and it becomes possible to set the shift ΔT of the input timing of the output signals for each of the pulse position digitalizing means in accordance with the delay time Td of the delay units forming the pulse delay circuit.

Further, when setting the shift ΔT of the input timings of the output signals of each of the pulse position digitalizing means by inverters differing in inversion levels, as in the fifth aspect of the invention, it is preferable to provide buffers at the output sides of the inverters to increase the input impedances of the circuits connected to the output sides of the inverters and prevent a change of the input timings of the output signals from the delay units input to the circuits even if the load capacities of the circuits connected through the buffers to the output side of the inverters (latch circuits etc. in pulse position digitalizing means) change due to the temperature.

That is, when providing inverters differing in inversion levels on the input paths from the delay units to the pulse position digitalizing means, if connecting in series the outputs of the inverters to latch circuits etc. forming the pulse position digitalizing means, the times required for inversion of the outputs of the inverters will also end up changing when the load capacities connected to the output sides of the inverters change due to the temperature, so if providing inverters for adjustment of the input timings of the output signals on the input paths of the output signals to the pulse position digitalizing means, as shown in the fifth aspect, it is preferable to provide buffers at the output sides of the inverters and operate the inverters without being affected by the later load capacities.

Note that as the buffers, it is possible to use gate circuits of the same characteristics (for example, inverters with constant inversion levels) such as the delay units forming the buffer delay circuit. Further, when using inverters for the buffers, the signal levels of the output signals input to the pulse position digitalizing means are inverted, so when it is not possible to operate the pulse position digitalizing means normally due to inversion of the signal levels, it is also possible to further invert the signal levels of the output signals input to the pulse position digitalizing means by providing buffers comprised of inverters before and after the inverters for adjusting the input timings of the output signals to the pulse position digitalizing means.

On the other hand, in the A/D conversion method of the first aspect of the invention, it is possible to operate the pulse position digitalizing means at the same timings by inputting a common sampling clock to the pulse position digitalizing means as in the sixth aspect and operating the pulse position digitalizing means by this common sampling clock.

Further, when operating the pulse position digitalizing means by a common sampling clock, as shown in the seventh aspect of the invention, by repeatedly operating the pulse position digitalizing means in synchronization with the sampling clock, outputting as the latest digital data a difference between current digital data and past digital data obtained in synchronization with the sampling clock from a specific pulse position digitalizing means among the plurality of pulse position digitalizing means, and outputting as the latest digital data a difference between current digital data obtained in synchronization with the sampling clock from another pulse position digitalizing means and past digital data obtained in synchronization with the sampling clock in the specific pulse position digitalizing means, it becomes possible to repeatedly perform A/D conversion of the analog input signal in synchronization with a sampling clock.

That is, by doing this, one of the pulse position digitalizing means digitalizes the number of delay units through which the pulse signal passes in the pulse delay means in a reference period Ts synchronized with the sampling clock, another pulse position digitalizing means digitalizes the number of delay units through which the pulse signal passes in the pulse delay means in a time of the reference period TS plus a time of a whole multiple of the shift $\Delta T$ of the input timing of output signal for each of the pulse position digitalizing means ($1 \times \Delta T, 2 \times \Delta T, 3 \times \Delta T, \ldots$), and the digital data obtained by this digitalization are added so as to generate high resolution digital data as the result of A/D conversion.

Note that when trying to repeatedly generate digital data by the pulse position digitalizing means by inputting a common sampling clock to the pulse position digitalizing means in this way, if configuring the pulse delay circuit as a delay line comprised of delay units simply connected in series, it would be necessary to greatly increase the number of delay units forming the pulse delay circuit, but if increasing the number of delay units forming the pulse delay circuit, an increase in the size of the pulse delay circuit would be invited.

Therefore, when executing the A/D conversion method of the seventh aspect of the invention, it is possible to use a pulse circulation circuit for circulating the pulse signal by using as the pulse delay circuit the delay units connected in a ring, counting the number of times of circulation of the pulse signal in the pulse circulation circuit after the input of the pulse signal to the pulse circulation circuit by a circulation counter, and, in each pulse position digitalizing means, digitalizing the pulse signal in the pulse circulation circuit in synchronization with the sampling clock to generate digital data having digital data obtained by the digitalization as lower bit data and having the number of times of circulation of the pulse signal counted by the circulation counter as higher bit data.

That is, by doing this, since the pulse signal is repeatedly passed through delay units connected in a ring in the pulse delay circuit, even if reducing the number of delay units forming the pulse delay circuit, it becomes possible to repeatedly perform the A/D conversion operation over a long period of time.

Next, the ninth to 16th aspects of the invention relate to an A/D converter for converting an analog input signal to digital data in accordance to the A/D conversion method of the first to eighth aspects of the invention.

According to a ninth aspect of the invention, there is provided an A/D converter for converting an analog input signal to digital data, provided with a pulse delay circuit comprised of a plurality of series-connected delay units outputting a pulse signal delayed by a delay time corresponding to a voltage level of the analog input signal; m number of pulse position digitalizing means latching output signals from the delay units forming the pulse delay circuit at predetermined timings after a pulse signal is input to the pulse delay circuit and generating digital data expressing reached positions of the pulse signal in the pulse delay circuit based on the levels of the latched signals; a delay means for shifting the input timings of the output signals from the delay units by a time shorter than the delay time of the delay units for each of the pulse position digitalizing means, and an adding means for adding digital data obtained by the pulse position digitalizing means and outputting the result as digital data expressing the analog input signal. Therefore, according to the A/D converter of the ninth aspect, it becomes possible to convert an analog input signal to digital data in accordance with the A/D conversion method of the first aspect and possible to obtain effects similar to those of the first aspect.

The A/D converter of the 10th aspect of the invention is configured as the A/D converter of the ninth aspect wherein the delay means delays the output signals so that the input timings of the output signals to the pulse position digitalizing means are shifted by exactly the amount of a time (Td/m) obtained by dividing the delay time (Td) of the delay units by the number (m) of the pulse position digitalizing means. Therefore, according to the 10th aspect, it becomes possible to convert the analog input signal to digital data in accordance with the A/D conversion method of the second aspect and obtain effects similar to the second aspect.

The A/D converter of the 11th aspect of the invention is configured as the A/D converter of the ninth aspect wherein the delay means is comprised of inverters provided on input paths of the output signals from the delay units forming the pulse delay circuit to the pulse position digitalizing means and having inversion levels set to levels different for each of the pulse position digitalizing means. Therefore, according to the A/D converter of the 11th aspect, it becomes possible to convert the analog input signal to digital data in accordance with the A/D conversion method of the third aspect and obtain effects similar to the third aspect.

The A/D converter of the 12th aspect of the invention is configured as the A/D converter of the 11th aspect wherein the inverters forming the delay circuit operate using the analog input voltage as their drive voltage. Therefore, according to the A/D converter of the 13th aspect, it becomes possible to convert the analog input signal to digital data in accordance with the A/D conversion method of the fifth aspect and obtain effects similar to the fifth aspect.

The A/D converter of the 13th aspect of the invention is configured as the A/D converter of the ninth aspect provided with buffers at output sides of the inverters forming the delay means. Therefore, according to the A/D converter of the 13th aspect, it becomes possible to convert the analog input signal to digital data in accordance with the A/D conversion method of the fifth aspect and obtain effects similar to the fifth aspect.

The A/D converter of the 14th aspect of the invention is configured as the A/D converter of the ninth aspect wherein the pulse position digitalizing means operate by receiving a common sampling clock. Therefore, according to the A/D converter of the 13th aspect, it becomes possible to convert the analog input signal to digital data in accordance with the A/D conversion method of the fifth aspect and obtain effects similar to the fifth aspect.

The A/D converter of the 15th aspect of the invention is configured as the A/D converter of the 14th aspect wherein a specific pulse position digitalizing means in the m number of pulse position digitalizing means is configured to output a difference between current digital data and past digital data generated in synchronization with the sampling clock to the adding means as digital data expressing the result of A/D conversion, and another pulse position digitalizing means is configured to output a difference between current digital data generated in synchronization with the sampling clock and past digital data generated in synchronization with the sampling clock in the specific pulse position digitalizing means to the adding means as digital data expressing the result of A/D conversion. Therefore, according to the A/D converter of the 15th aspect, it becomes possible to convert the analog input signal to digital data in accordance with the A/D conversion method of the seventh aspect and obtain effects similar to the seventh aspect.

The A/D converter of the 16th aspect of the invention is configured as the A/D converter of the 15th aspect wherein the pulse delay circuit is configured by a pulse circulation circuit for circulating the pulse signal by connecting the delay units in a ring, a circulation counter for counting the number of times of circulation of the pulse signal in the pulse circulation circuit is provided, and the pulse position digitalizing means is configured so as to digitalize the pulse signal in the pulse circulation circuit in synchronization with the sampling clock to generate digital data having digital data obtained by the digitalization as lower bit data and having the number of times of circulation of the pulse signal counted by the circulation counter as higher bit data. Therefore, according to the A/D converter of the 16th aspect, it becomes possible to convert the analog input signal to digital data in accordance with the A/D conversion method of the eighth aspect and obtain effects similar to the eighth aspect.

BRIEF DESCRIPTION OF THE DRAWINGS

These and other objects and features of the present invention will become clearer from the following description of the preferred embodiments given with reference to the attached drawings, wherein:

FIG. 5 is an explanatory view of the operation of inverters forming an inverter group of the embodiment;

DESCRIPTION OF THE PREFERRED EMBODIMENTS

Figure 1:
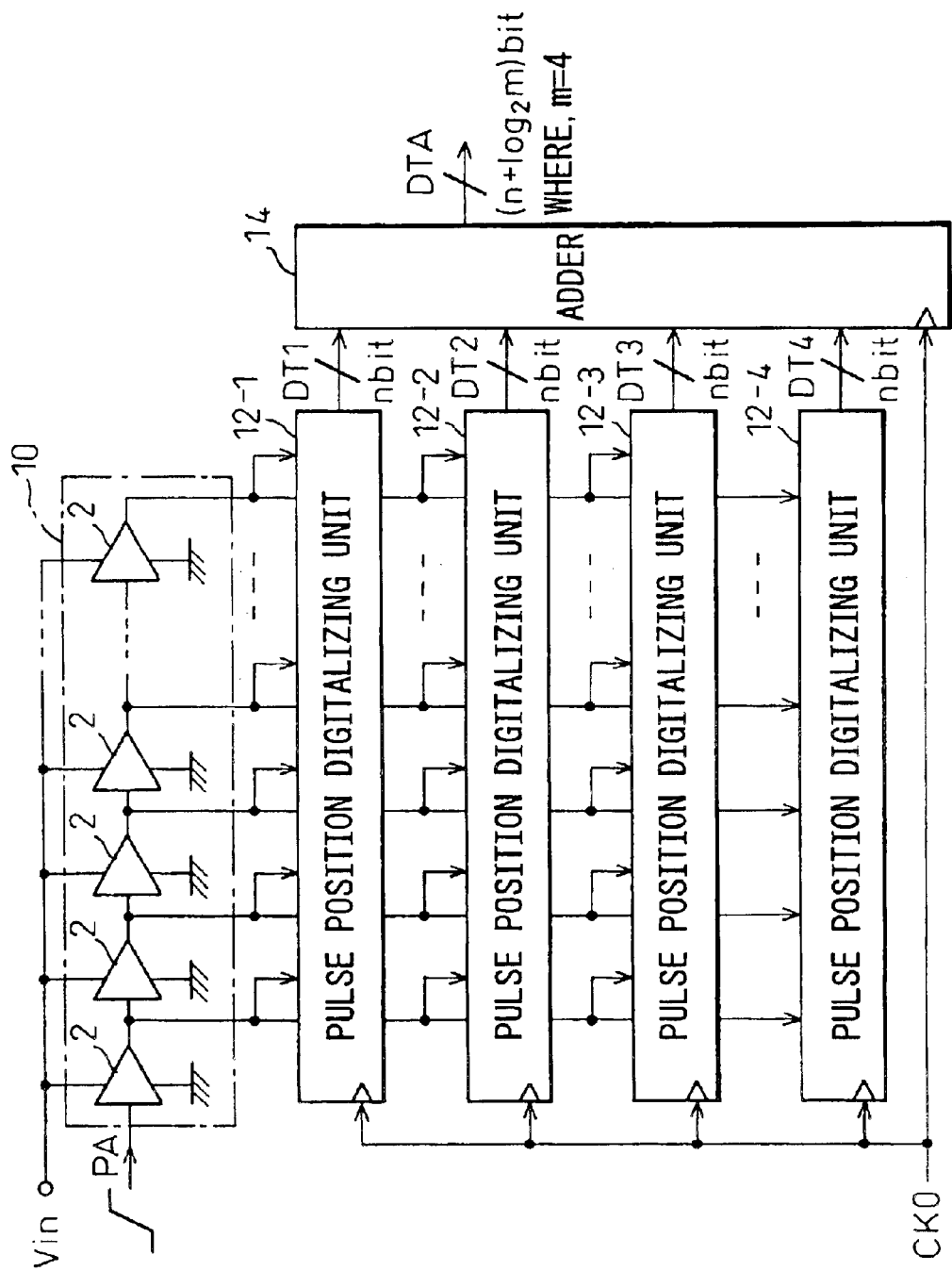
FIG. 1 is a block diagram of the configuration of an A/D converter of an embodiment of the present invention.

Next, a preferred embodiment of the present invention will be explained with reference to the drawings. FIG. 1 is a block diagram of the configuration of an A/D converter of an embodiment of the present invention.

As shown in FIG. 1, the A/D converter of the embodiment is comprised of a pulse delay circuit 10 comprised of a plurality of series-connected delay units 2 outputting a pulse signal with a delay, m number of (m=4 in the present embodiment) pulse position digitalizing units (corresponding to pulse position digitalizing means of the present invention) 12-1, 12-2, 12-3, and 12-4 for latching output signals from the delay units 2 forming the pulse delay circuit 10 in synchronization with the timings of rising edges (or trailing edges) of a sampling clock CK0 input periodically from the outside and generating n bits of digital data DT1 to DTm by digitalizing the reached positions of the pulse signal PA in the pulse delay circuit 10 from the points of change of the signal levels of the latched output signals, and an adder (corresponding to adding means of present invention) 14 for adding the m number of (four) digital data DT1 to DT4 output from the pulse position digitalizing units 12-1 to 12-4 in synchronization with the timing of the rising edges (or trailing edges) of the sampling clock CK0 to generate "n+log$_2$ m" bits (in the present embodiment, "n+2" bits) of digital data DTA and outputting the result to the outside.

Here, the delay units 2 forming the pulse delay circuit 10 are for example comprised of gate circuits comprised of two front and rear stage inverters etc. (see FIG. 4). The delay units 2 are supplied with the analog input signal (voltage) Vin for A/D conversion as the drive voltage.

Figure 2:
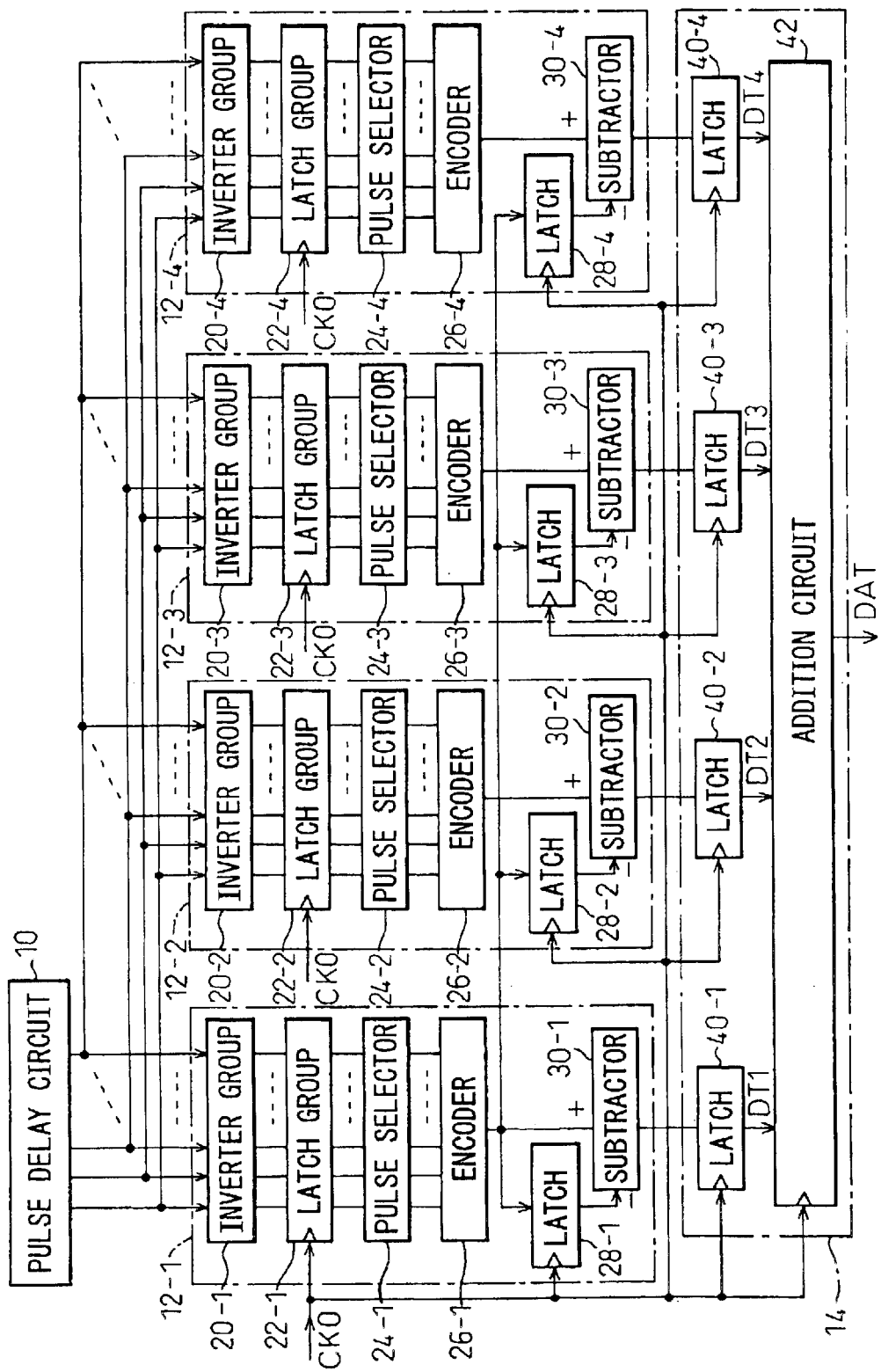
FIG. 2 is a block diagram of the configuration of a pulse position digitalizing unit of the embodiment.

The adder 14, as shown in FIG. 2, is comprised of latch circuits 40-1, 40-2, 40-3, and 40-4 for latching the digital data DT1 to DT4 output from the pulse position digitalizing units 12-1 to 12-4 in synchronization with the timing of the rising edges (or trailing edges) of the sampling clock CK0 and an addition circuit 42 for adding the digital data DT1 to DT4 latched by the latch circuits 40-1 to 40-4 in synchronization with the timing of the rising edges (or trailing edges) of the sampling clock CK0.

On the other hand, the pulse position digitalizing unit 12-1 to 12-4, as shown in FIG. 2, are comprised of inverter groups 20-1, 20-2, 20-3, and 20-4 for fetching output signals from the delay units 2 forming the pulse delay circuit 10 at input timings different for each of the pulse position digitalizing units 12-1 to 12-4, latch groups 22-1, 22-2, 22-3, and 22-4 for latching output signals from the delay units 2 input through the inverter groups 20-1 to 20-4 at the timings of rising edges (or trailing edges) of the sampling clock CK0, pulse selectors 24-1, 24-2, 24-3, and 24-4 for detecting the positions at which the outputs from the delay units 2 in the pulse delay circuit 10 change from the high level to the low level (that is, the reached positions of the pulse signal in the pulse delay circuit 10) based on the output signals from the delay units 2 latched by the latch groups 22-1 to 22-4, encoders 26-1, 26-2, 26-3, and 26-4 for converting the results of detection of the pulse selectors 24-1 to 24-4 (reached positions of pulse signals in pulse delay circuit 10) to digital data, latch circuits 28-1, 28-2, 28-3, and 28-4 for latching the output from the encoder 26-1 of a specific pulse position digitalizing unit (in the present embodiment, the pulse position digitalizing unit 12-1) among the pulse position digitalizing units 12-1 to 12-4 at the timing of a rising edge (or trailing edge) of the sampling clock CK0, and a subtractor 38 for finding the difference between the current digital data (current value) output from the encoders 26-1 to 26-4 and past digital data from the encoder 26-1 latched by the latch circuits 28-1 to 28-4 and outputting this as n bits of digital data DT1 to DTm.

Figure 3A:
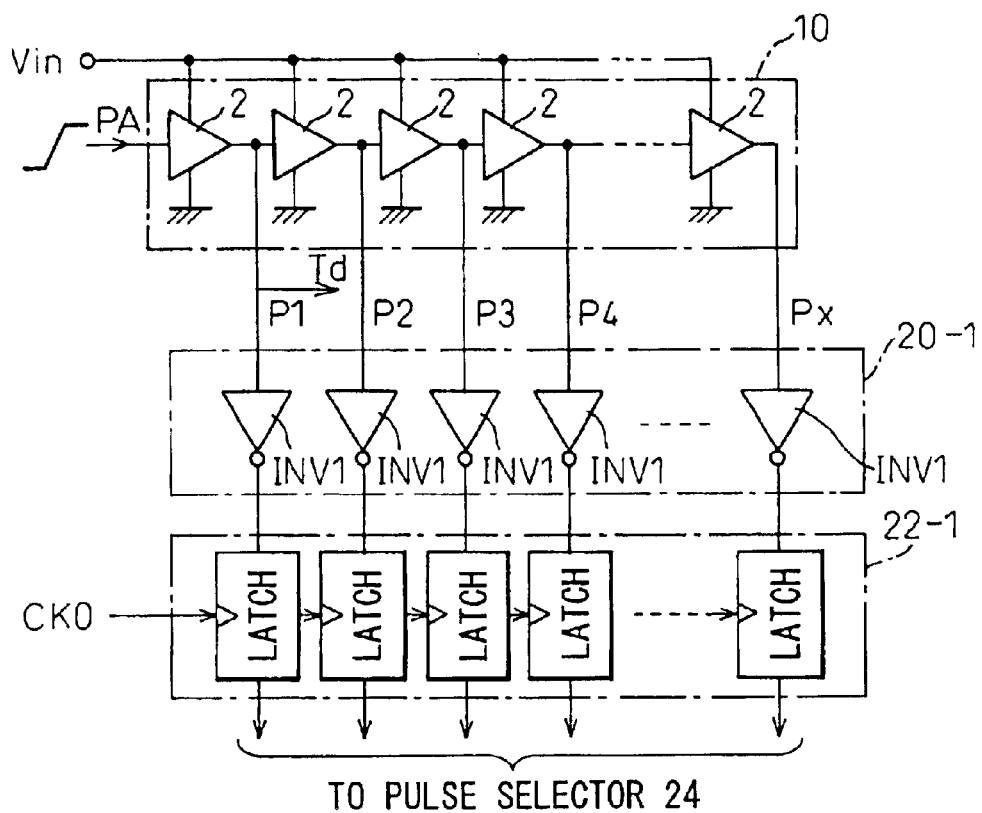
FIGS. 3A and 3B are views explaining the configurations of an inverter group and a latch group of the embodiment.

The inverter groups 20-1 to 20-4 and latch groups 22-1 to 22-4 in the pulse position digitalizing units 12-1 to 12-4, as shown in FIG. 3A (in the figure, only the inverter group 20-1 and latch group 22-1 in the pulse position digitalizing unit 12-1 shown), are provided in exactly the numbers corresponding to the number of delay units 2 forming the pulse delay circuit 10 so as to individually fetch and latch the output signals from the delay units 2 forming the pulse delay circuit 10.

For the inverters INV forming the inverter groups 20-1 to 20-4, inverters INV1, INV2, INV3, and INV4 differing in inversion levels (in other words, switching levels) are used for each of the pulse position digitalizing units 12-1 to 12-4.

Figure 3B:
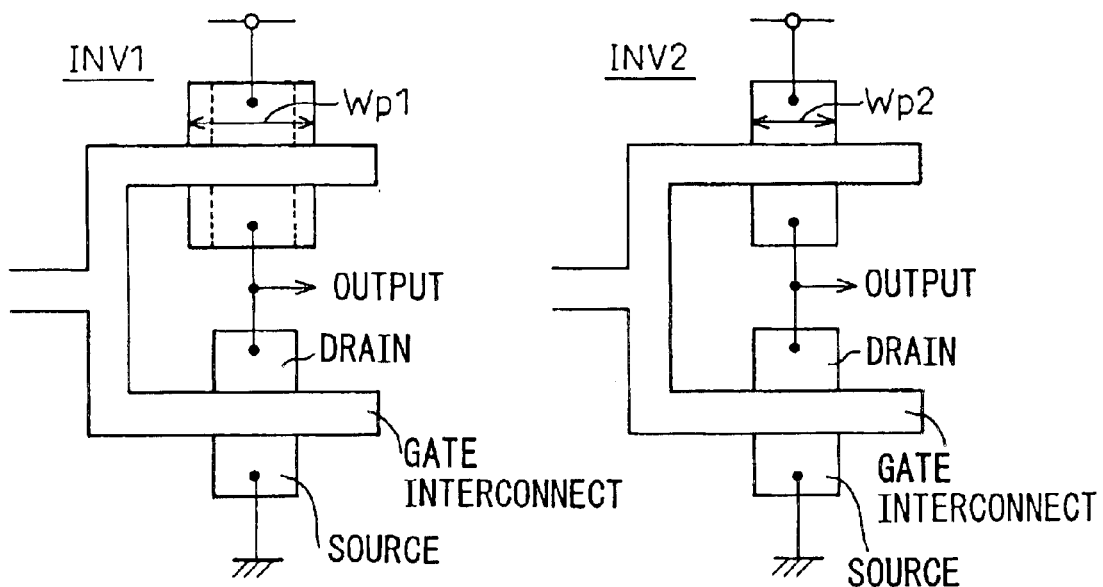
Figure 4:
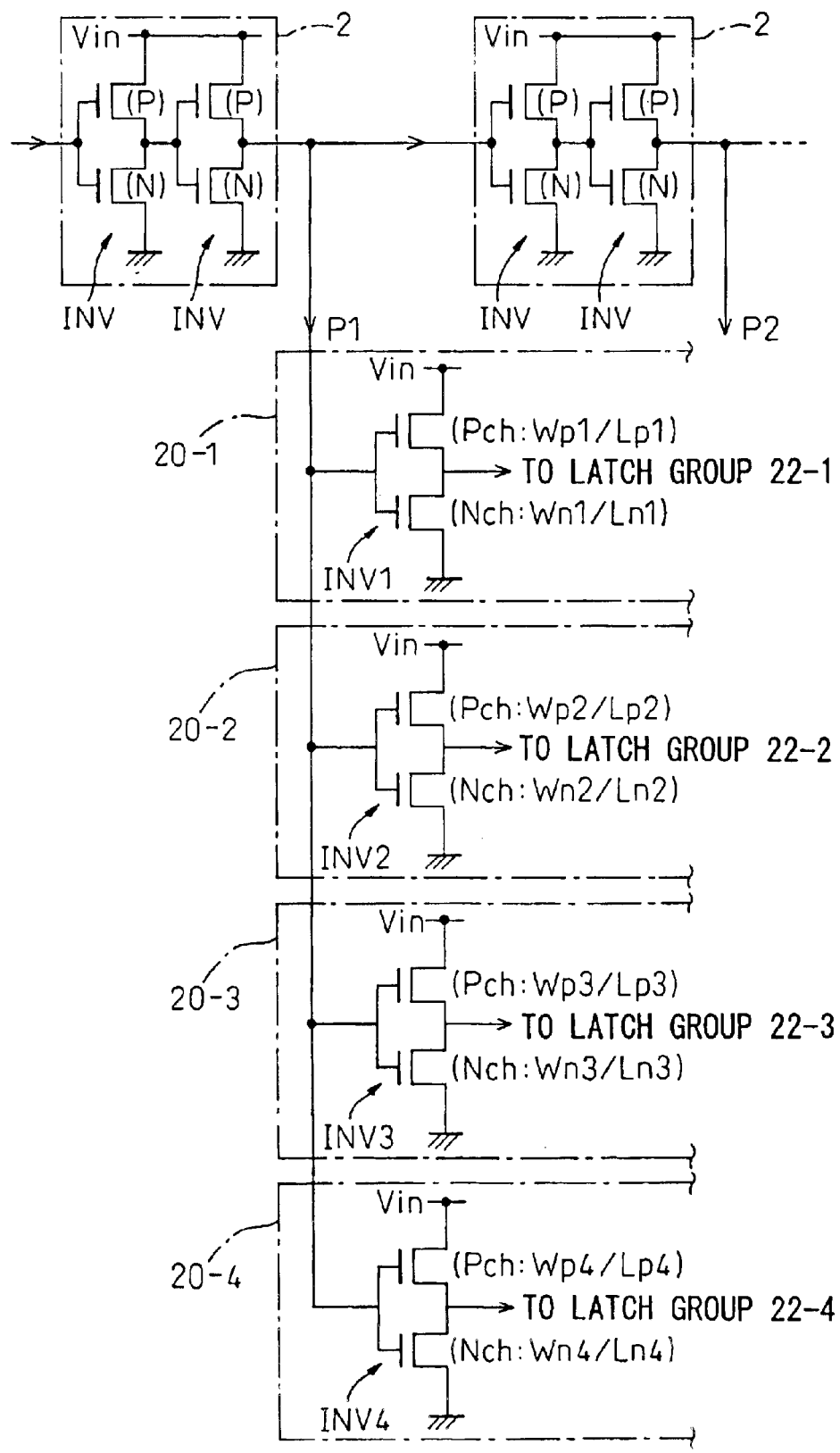
FIG. 4 is an electrical circuit diagram showing the inverter groups and delay units of the embodiment.

That is, as shown in FIG. 4, the inverters INV1 to INV4 forming the inverter groups 20-1 to 20-4, in the same way as the inverters INV forming the delay units 2, are configured by CMOS inverters comprised of p-channel transistors (FET) and n-channel transistors (FET). The inversion levels, for example, as shown in FIG. 3B, are set to different levels by adjusting the transistor widths Wp of the p-channel transistors (FET) forming the inverters INV1 to INV4 (in the figure, shown as the transistor widths Wp1 and Wp2 of the inverters INV1 and INV2).

That is, the inversion times and transition times of the inverters INV1 to INV4 can be freely set by the structures of the transistors forming the inverters INV1 to INV4, but in the present embodiment, the transistor widths Wp1, Wp2, Wp3, and Wp4 of the p-channel transistors (FET) forming the inverters are adjusted so that Wp1>Wp2>Wp3>Wp4 so that thereby, as shown in FIG. 5, the transition time Tf of the output level with respect to a change in level of the input signal becomes substantially equal to the delay time Td of the delay units 2. Further, the inversion levels become voltage levels (inversion levels 1 to 4 shown in figure) substantially dividing into "m+1" equal parts (here, five equal parts) the amounts of change (difference between low level and high level) of the signal levels of the output signals from the delay units 2 (delay pulse P1 shown in figure). The input timings of the output signals (delay pulses) input from the delay units 2 of the pulse delay circuit 10 to the pulse position digitalizing units 12-1 to 12-4 (more particularly the latch groups 22-1 to 22-4) become shifted by exactly the time Td/m obtained by dividing the delay time Td of the delay units 2 by the number m (in this embodiment, m=4) of pulse position digitalizing units 12-1 to 12-4.

Note that to set the inversion levels of the inverters INV1 to INV4 to different levels as in the present embodiment, it is not always necessary to adjust the transistor widths Wp of the p-channel transistors forming the inverters INV1 to INV2. It is also possible to adjust the gate lengths Lp of the p-channel transistors or the gate lengths Ln or Wn of the n-channel transistors or to adjust all or some of the above parameters.

Further, the input timings of the output signals (delay pulses) to the pulse position digitalizing units 12-1 to 12-4 are designed so as not to deviate from Td/m due to a change in voltage of the analog input signal Vin, so in the present embodiment, as shown in FIG. 4, the inverters INV1 to INV4 forming the inverter groups 20-1 to 20-4 are also designed to be driven by the analog input signal Vin for A/D conversion in the same way as the delay units 2.

As a result, in the A/D converter of the present embodiment, when inputting the pulse signal PA to the pulse delay circuit 10 and propagating the pulse signal PA inside the pulse delay circuit 10, the digital data DT1 to DTm generated in synchronization with the sampling clock CK0 at the pulse position digitalizing units 12-1 to 12-4 fluctuate in the least significant bit (LSB) due to the shift of the input timings of the output signals (delay pulse) from the delay units 2 input to the latch groups 22-1 to 22-4 through the inverter groups 20-1 to 20-4 in the pulse position digitalizing units 12-1 to 12-4. The voltage resolution of the digital data of the result of A/D conversion finally obtained by the addition operation of the adder 14 becomes a resolution higher by exactly the number of bits ($\log_2 m$) increased due to addition compared with the voltage resolution of the digital data obtained by one pulse position digitalizing unit 12.

Therefore, according to the A/D converter of this embodiment, compared with a conventional A/D converter formed by a pulse delay circuit 10 and a single pulse position digitalizing unit 12, it is possible to raise the voltage resolution of the digital data DTA obtained as a result of the A/D conversion without reducing the speed of A/D conversion. Further, compared with a conventional A/D converter, if there is no need to raise the voltage resolution of the digital data DTA obtained, it is possible to shorten the periods of the sampling clocks CK1 to CKm and perform the A/D conversion at a higher speed.

Figure 6A:
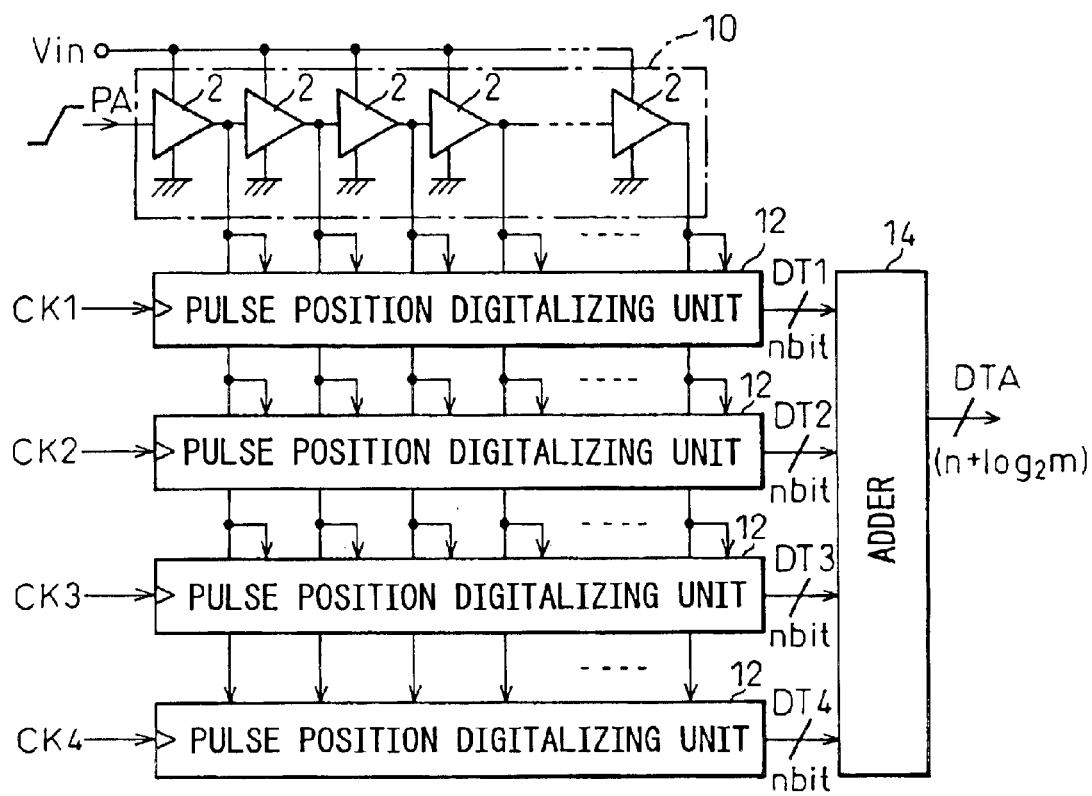
FIGS. 6A and 6B are block diagrams of the configuration of the A/D converter of Reference Example 1.
Figure 6B:
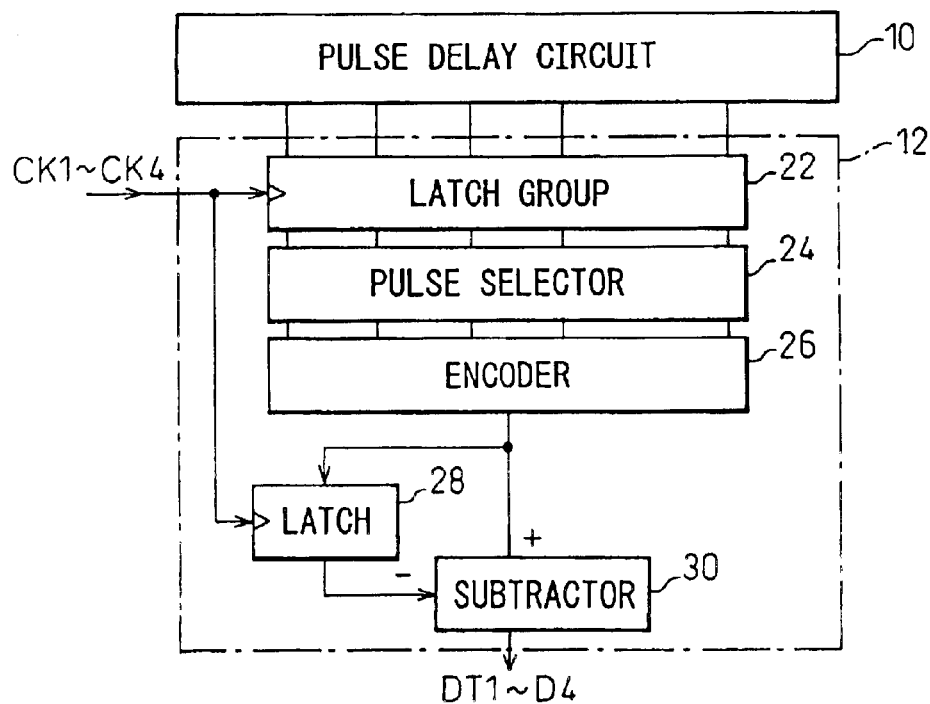

Further, as the method of raising the number of bits of the digital data finally obtained (in other words, the voltage resolution) by using a plurality of pulse position digitalizing units 12 to digitalize the reached positions of the pulse signal in the pulse delay circuit 10 and adding the digitalized results (digital data) as in the A/D converter of the present embodiment, for example, as shown in Reference Example 1 shown in FIGS. 6A and 6B, it may be considered to commonly configure all of the m number of (four) pulse position digitalizing units 12 using latch groups 22, pulse selectors 24, encoders 26, latch circuits 28 for latching the outputs from those encoders 26, and subtractors 30 for calculating the differences between the outputs of the latch circuits 28 and the outputs from the encoders 26 (see FIG. 6B), input the sampling clocks CK1 to CK4 shifted in phase by exactly 1/m of the sampling period to the pulse position digitalizing units 12 (see FIG. 6A), and generate digital data at different timings.

However, with the A/D conversion method of Reference Example 1, while the A/D conversion timings of the pulse position digitalizing units 12 differ, the A/D conversion characteristics of the pulse position digitalizing units 12 all become the same A/D conversion characteristics (A/D conversion characteristic 1 with no offset shown in FIG. 7), and the resolutions of the digital data obtained by the pulse position digitalizing units 12 all become the same. Accordingly, no improvement in resolution is obtained if the input voltage Vin does not change time-wise.

As opposed to this, with the A/D converter of the present embodiment, the timings of fetching the output signals (delay pulses) from the delay units 2 in the pulse position digitalizing units 12-1 to 12-4 are shifted by exactly the time of 1/m of the delay time Td of the delay units 2 for each of the pulse position digitalizing units 12-1 to 12-4, so in practice the same thing is obtained as if the sampling times for detecting the reached positions of the pulse signals at the pulse position digitalizing units 12-1 to 12-4 were shifted by exactly the time of 1/m of the delay time Td of the delay units 2.

Figure 7:
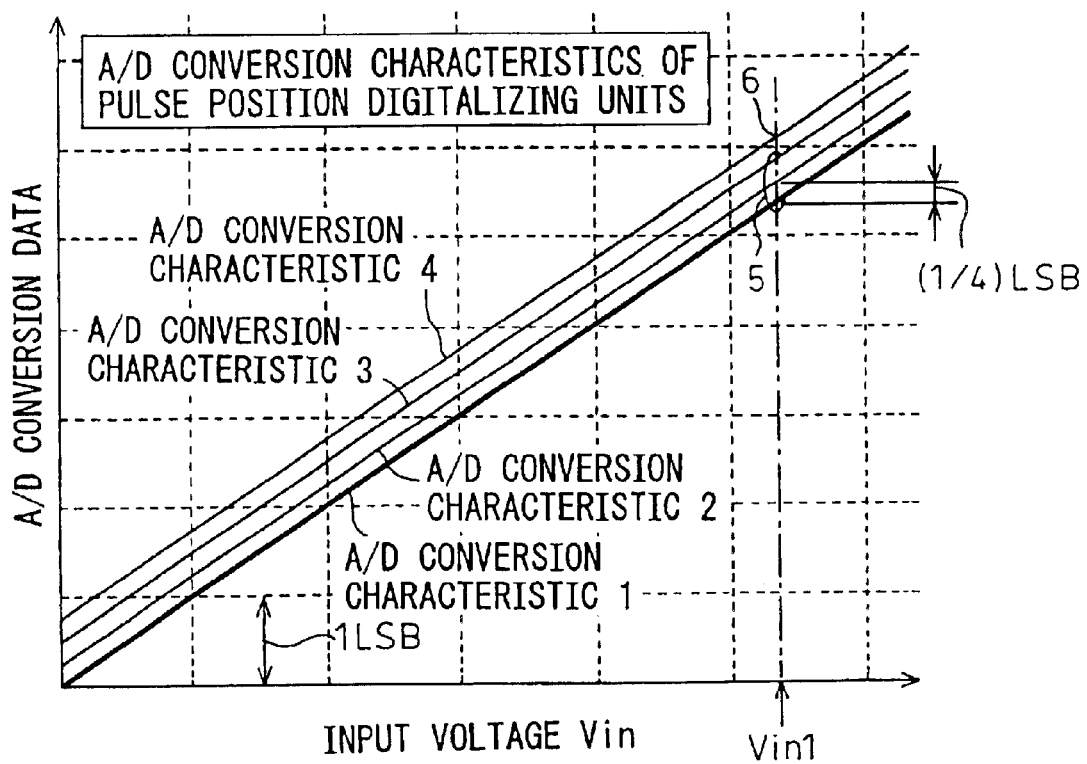
FIG. 7 is an explanatory view of the A/D conversion characteristics of the pulse position digitalizing units of the embodiment.

As a result, looking at the A/D conversion characteristics of the pulse position digitalizing units 12-1 to 12-4, as shown in FIG. 7, if making the A/D conversion characteristic of the pulse position digitalizing unit 12-1 the A/D conversion characteristic 1 with no offset, the A/D conversion characteristics of the other pulse position digitalizing units 12-2 to 12-4 become the three types of A/D conversion characteristics 2 to 4 obtained by successively adding a constant amount of offset (=1/m of LSB) to the reference A/D conversion characteristic 1, and the resolutions of the digital data obtained at the pulse position digitalizing units 12-1 to 12-4 can be set to values differing by exactly 1/m amounts of the LSB.

Therefore, according to the A/D converter of the present embodiment, both when the analog input signal Vin fluctuates and when the voltage level of the analog input signal Vin remains constant and does not change, due to the difference in offsets of the pulse position digitalizing units 12-1 to 12-4, the digital data obtained at the pulse position digitalizing units 12 will become different values and, compared with Reference Example 1, the analog input signal Vin can be converted from an analog to digital format more precisely.

That is, in Reference Example 1 shown in FIGS. 6A and 6B, when the analog input signal Vin fluctuates, a result of A/D conversion substantially the same as in the present embodiment (in FIG. 7, 6+5×3=21) will be obtained, but when the voltage level of the analog input signal Vin is constant, the digital data obtained by the pulse position digitalizing units 12 will all become the same values, so the voltage resolution of the digital data finally obtained will not be able to be raised. As opposed to this, according to the A/D converter of the present embodiment, even if the voltage level of the analog input signal Vin is constant, the digital data obtained by the pulse position digitalizing units 12 will become different values, so it will be possible to raise the voltage resolution of the digital data finally obtained.

Figure 8:
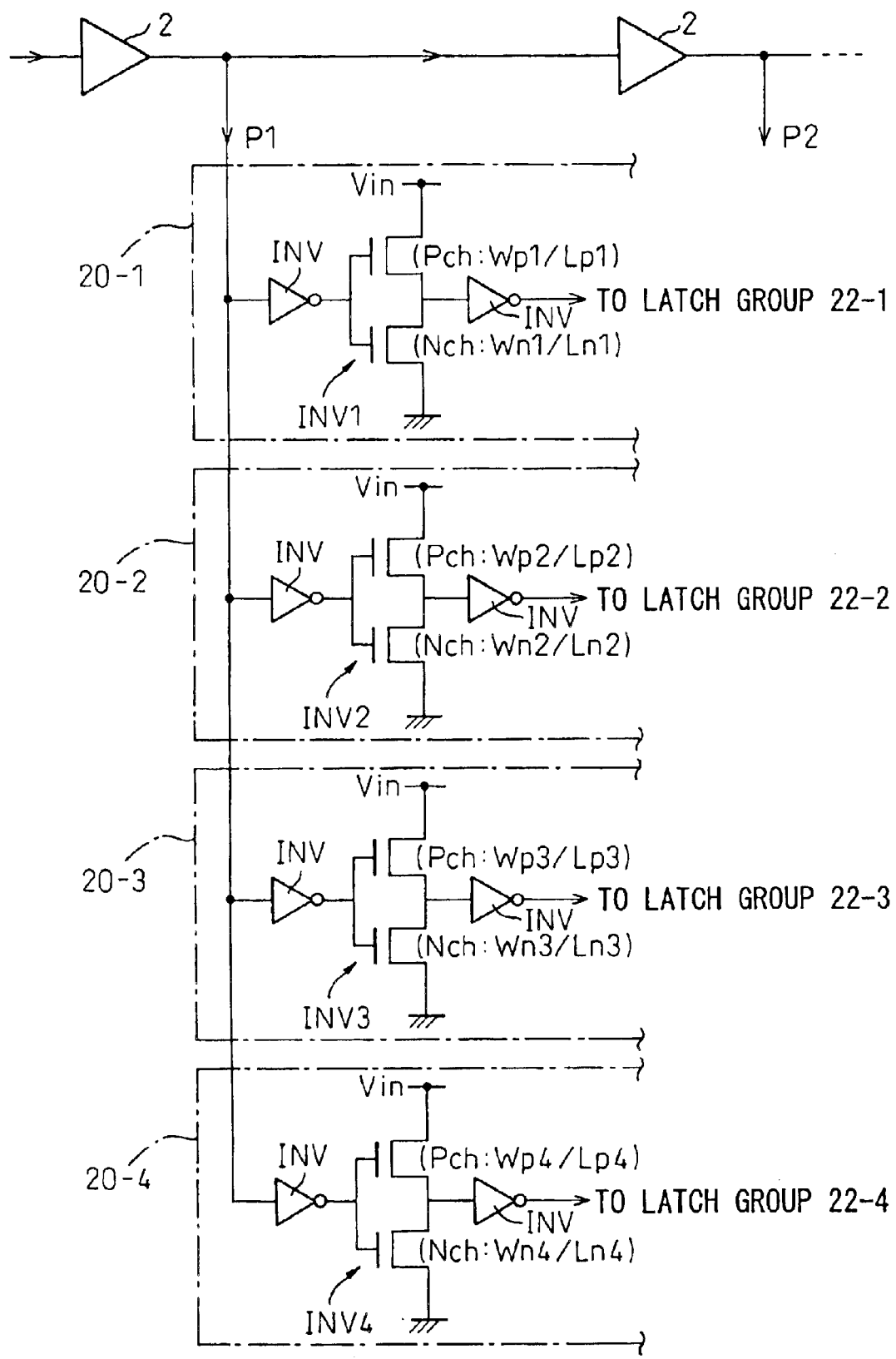
FIG. 8 is an electrical circuit diagram of another example of the configuration of an inverter group of the embodiment.

While an embodiment of the present invention was explained above, the present invention is not limited to this embodiment. Various modifications are possible. For example, in this embodiment, the explanation was given of providing the inverter groups 20-1 to 20-4 for shifting the input timings of the output signals (delay pulses) from the delay units 2 forming the pulse delay circuit 10 for each of the pulse position digitalizing units 12-1 to 12-4 with inverters INV1 to INV4 with different inversion levels for each of the delay units 2 in the pulse delay circuit 10, but when using the A/D converter in an environment with large temperature changes (for example, an automobile), as shown in FIG. 8, it is also possible to provide at least the output sides (in FIG. 8, the input sides and output sides) of the inverters INV1 to INV4 forming the inverter groups 20-1 to 20-4 with general inverters the same as the inverters INV forming the delay units 2 in the pulse delay circuit 10 (however, having a drive capability changed in accordance with need, that is, having switching levels generally set, but having sizes of the p-channel and n-channel transistors increased in accordance with the conditions) and use these as buffers.

That is, for example, when providing inverters INV1 to INV4 differing in inversion levels in the input paths of the output signals (delay pulses) from the delay units 2 to the pulse position digitalizing units 12-1 to 12-4, if directly connecting the outputs of the inverters INV1 to INV4 to latch circuits forming the latch groups 22-1 to 22-4, the times required for inversion of the outputs of the inverters INV1 to INV4 will also end up changing when the load capacities at the output sides of the inverters INV1 to INV4 change due to temperature, so when using the A/D converter in an environment with large temperature changes (for example, an automobile), it is sufficient to provide buffers comprised of inverters at the output sides of the inverters INV1 to INV4 to enable operation of the inverters INV1 to INV4 without being influenced by later load conditions.

Further, in the present embodiment, the pulse position digitalizing units 12-1 to 12-4 operate at timings of the rising edges (or trailing edges) of the sampling clock CK0 input periodically from the outside. Among the pulse position digitalizing units 12-1 to 12-4, the explanation was given of finding the difference between the digital data generated at the timing of the rising edge (or trailing edge) of the past sampling clock CK0 at the pulse position digitalizing unit 12-1 and the digital data generated at the timings of the rising edges (or trailing edges) of the current sampling clock CK0 at the pulse position digitalizing units 12-1 to 12-4, but with this method, it is necessary to greatly increase the number of delay units 2 forming the pulse delay circuit 10 to repeatedly generate the digital data and therefore a larger size of the pulse delay circuit 10 is invited.

Figure 9:
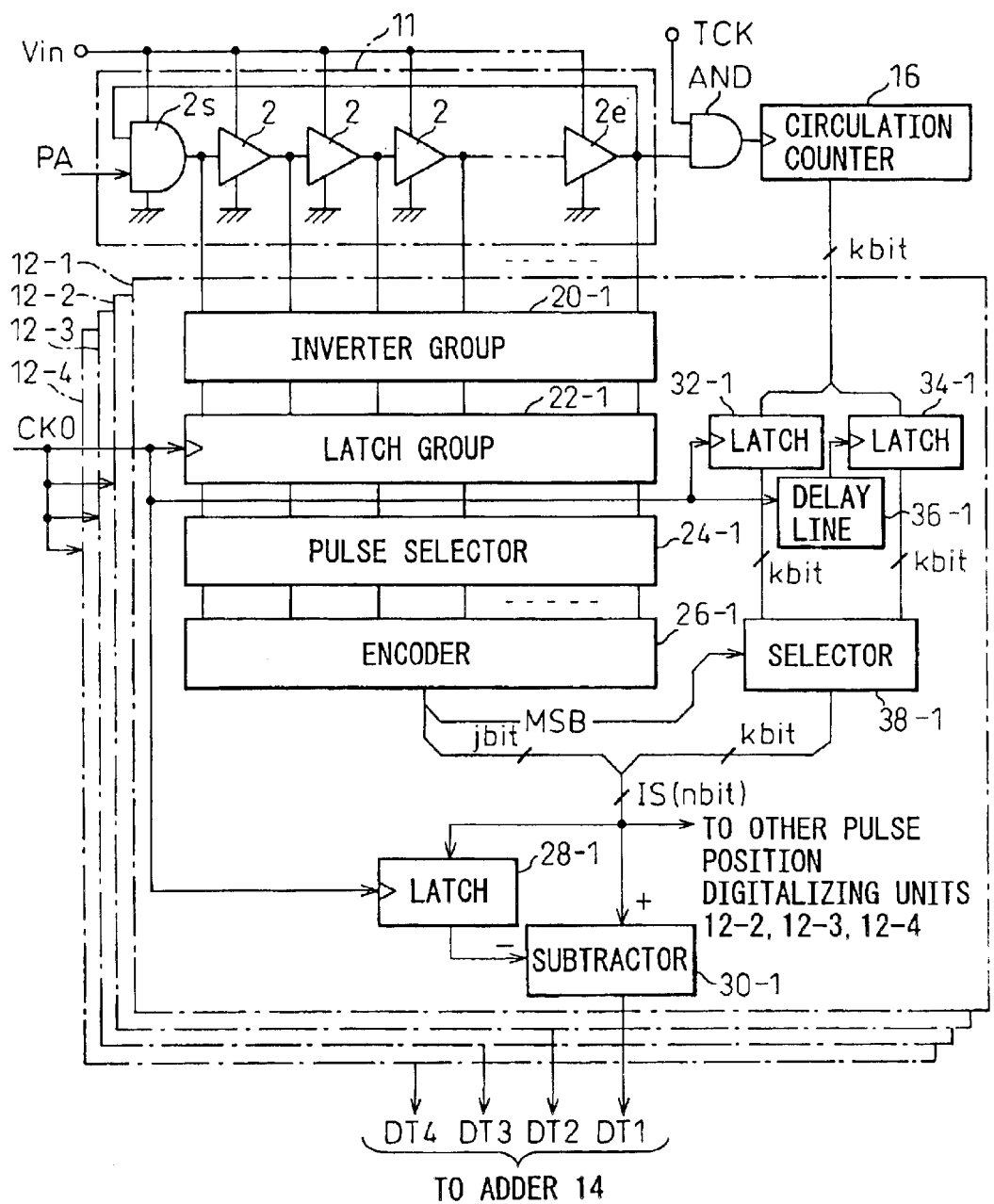
FIG. 9 is a block diagram of the configuration of an A/D converter using a pulse circulation circuit as the pulse delay circuit.

Therefore, when repeatedly generating digital data in synchronization with the sampling clock CK0 in the pulse position digitalizing units 12-1 to 12-4, it is also possible to configure the A/D converter as shown in FIG. 9. That is, in the A/D converter shown in FIG. 9, a pulse circulation circuit 11 is provided connecting the delay units 2 in a ring as the pulse delay circuit and thereby returning the pulse signal PA from the final stage delay unit 2e to the initial stage delay unit 2s to cause the pulse signal to circulate through it. By inputting the output from the final stage delay unit 2s of this pulse circulation circuit 11 to a circulation counter 16 through an AND circuit AND, the number of times of circulation of the pulse signal in the pulse circulation circuit 11 is counted by the circulation counter 16.

Further, the pulse position digitalizing unit 12-1 is provided with, in addition to the inverter group 20-1, latch group 22-1, pulse selector 24-1, encoder 261, latch circuit 28-1, and subtractor 30-1, a latch circuit 32-1 for latching the output (k bits) of the circulation counter 16 at the timing of a rising edge (trailing edge) of the sampling clock CK, a latch circuit 34-1 for receiving the sampling clock CK through a delay line 36-1 having a delay time shorter than that period (about half) and latching the output (k bits) from the circulation counter 16 at the timing of a rising edge (or trailing edge), and a selector 38-1 for selecting the output from the latch circuit 32-1 when the bit data of the most significant bit (MSB) of the digital data (j bits) output from the encoder 26-1 is the low level and selecting the output from the latch circuit 34-1 when the bit data is the high level and generates n bits of digital data IS having the output (j bits) from the encoder 26-1 as the lower bit data and the output (k bits) from the selector 38-1 as the upper bit data.

Further, the digital data IS is input to and latched by the latch circuit 28-1 in the same way as in the present embodiment, the difference between the latched past digital data IS and the currently generated digital data IS is calculated at the subtractor 30-1, and the result of calculation is output as the digital data DT1 to the not shown adder 14.

Further, while not shown, the other pulse position digitalizing units 12-2 to 12-4 are configured in the same way as the pulse position digitalizing unit 12-1. In the same way as the pulse position digitalizing unit 12-1, they generate n bits of digital data IS, calculate the difference between the generated digital data and the past digital data of the pulse position digitalizing unit 12-1 latched at the latch circuits 28-2 to 28-4 at the subtractor 30-1, and output the results of calculation as the digital data DT2 to DT4.

As a result, according to the A/D converter shown in FIG. 9, it becomes possible to circulate a pulse signal in the pulse circulation circuit 11 serving as the pulse delay circuit and convert the analog input signal Vin from an analog to digital format based on the number of times of circulation and the reached positions of the pulse signal in the pulse circulation circuit 11. Even if the number of the delay units 2 forming the pulse delay circuit (more particularly, the pulse circulation circuit 11) is reduced, the A/D conversion operation can be repeatedly performed over a long period of time.

Note that the AND circuit AND provided in the input path of the pulse signal from the pulse circulation circuit 11 to the circulation counter 16 is provided so as to input the output from the delay unit 2e to the circulation counter 16 and allow a count operation of the circulation counter 16 when the input terminal of the side of the pulse circulation circuit 11 not connected to the final stage delay unit 2e is at the high level and to input the test clock TCK for a counter test to the input terminal of the side not connected to the final stage delay unit 2e and thereby enable the count operation of the circulation counter 16 to be tested from the outside when conversely the circulation operation of the pulse circulation circuit 11 is in the suspended state and the output of the final stage delay unit 2e is at the low level.

Figure 10:
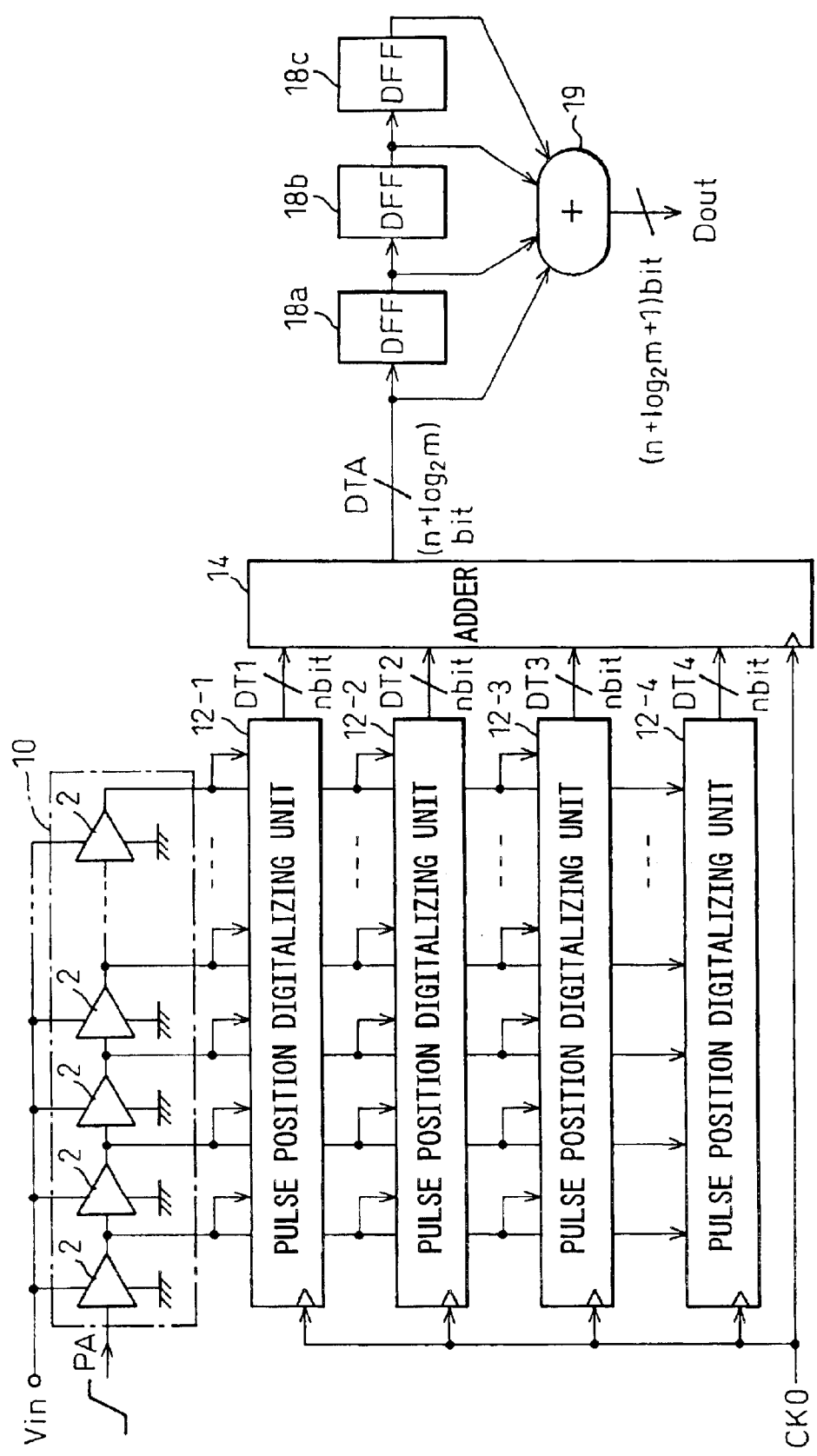
FIG. 10 is a block diagram of the configuration of an A/D converter provided with a circuit for obtaining a moving average of the result of A/D conversion.

Next, in the present embodiment, the explanation was given with reference to the case of outputting the digital data obtained by the operation of the adder 14 as it is as the result of A/D conversion of the analog input signal Vin, but to improve the SN ratio (signal to noise ratio) of the result of the A/D conversion, for example, as illustrated in FIG. 10, it is also possible to successively shift and latch the digital data DTA after addition output from the adder 14 by the latch circuits 18a, 18b, and 18c comprised of D-flip-flops etc. and add the past three times of digital data DTA latched by the latch circuits 18a, 18b, and 18c and the final value of the digital data DTA output from the adder 14 by an addition circuit 19 so as to obtain the moving average of the digital data DTA. Note that in FIG. 10, the addition circuit 19 is configured so that the digital data Dout after the moving average output from the addition circuit 19 becomes the number of bits of the digital data DTA output from the adder 14 plus 1 bit, that is, "n+log$_2$ m+1" bits.

Above, embodiments and modifications of the present invention were explained. Next, in the same way as in the present invention, the method of A/D conversion of an analog input signal Vin by a voltage resolution similar to the present invention by using a plurality of pulse position digitalizing units 12 to digitalize the reached positions of the pulse signal in the pulse delay circuit 10 and adding the results of the digitalization (digital data) will be explained (Reference Example 2).

Figure 11A:
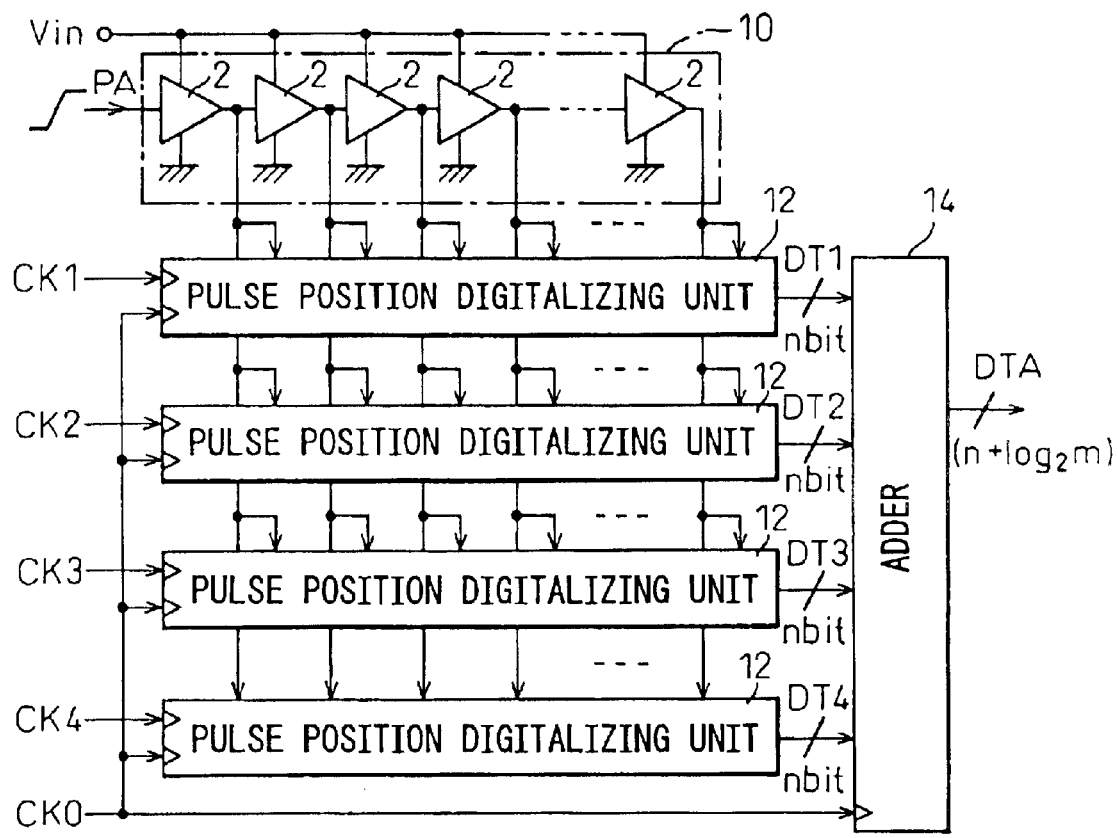
FIGS. 11A and 11B are explanatory views of the configuration of an A/D converter of Reference Example 2 and sampling clocks.

FIG. 11A is a block diagram of the configuration of an A/D converter of Reference Example 2. As shown in FIG. 11A, the A/D converter of Reference Example 2, like the A/D converter of the embodiment shown in FIG. 1, is comprised of a pulse delay circuit 10, m number of (four) pulse position digitalizing units 12-1 to 12-2, and an adder 14 for adding the m number of (four) digital data DT1 to DTm (DTm=DT4) output from the pulse position digitalizing units 12-1 to 12-4 to generate the "n+log$_2$ m" bits of digital data DTA.

Figure 11B:
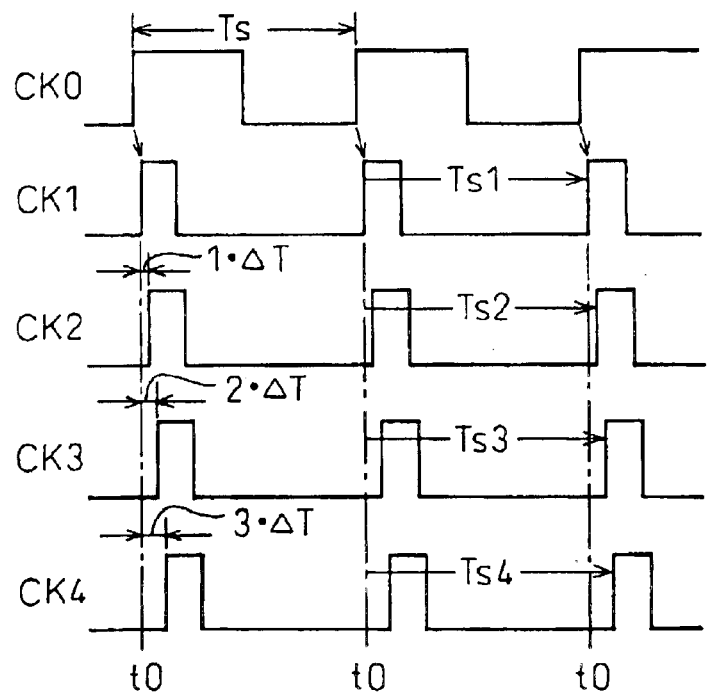
Figure 12:
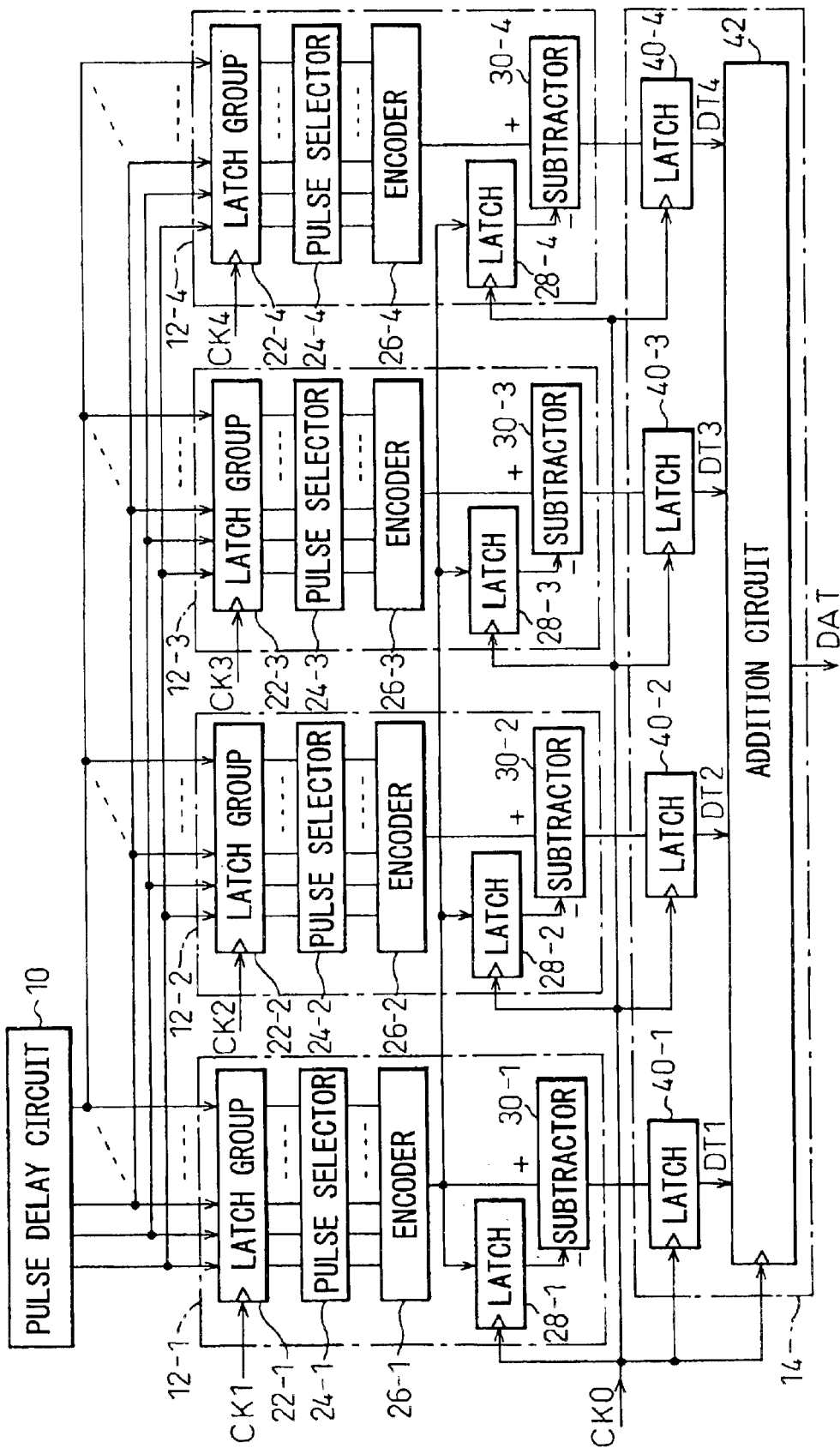
FIG. 12 is a block diagram of the configuration of a pulse position digitalizing unit of Reference Example 2.

Further, the A/D converter of Reference Example 2 differs from the A/D converter of the above embodiment in that the four pulse position digitalizing units 12-1 to 12-4 are configured as shown in FIG. 12 and the pulse position digitalizing units 12-1 to 12-4 receive as input the reference clock CK0 of a constant period (period: Ts) shown in FIG. 11B and one of the four sampling clocks CK1 to CK4 generated based on this reference clock CK0.

That is, as shown in FIG. 11B, the four sampling clocks CK1 to CK4 input to the four pulse position digitalizing units 12-1 to 12-4 are generated by delaying the reference clock CK0. The phases of the sampling clocks CK1 to CK4 are shifted from each other by exactly a unit time ΔT obtained by dividing the delay time Td of the delay units 2 forming the pulse delay circuit 10 by the number m (that is, "4") of the sampling clocks CK1 to CK4. That is, the sampling clocks CK2 to CK4 are delayed by exactly a whole multiple of the unit time ΔT (1×ΔTs, 2×ΔTs, 3×ΔTs) based on the sampling clock CK1.

Further, as shown in FIG. 12, the four pulse position digitalizing units 12-1 to 12-4 lack the inverter groups 20-1 to 20-4 from the embodiment shown in FIG. 2 and are configured to directly input the outputs from the delay units 2 forming the pulse delay circuit 10 to the latch groups 22-1 to 22-4.

According to the A/D converter of Reference Example 2 configured in this way, in the same way as the above embodiment, the number of the delay units 2 through which a pulse signal PA passes in the pulse delay circuit 10 is digitalized by sampling periods shifted by exactly the time ΔT based on one period Ts of the sampling clock CK1 (Ts, Ts+ΔT, Ts+2×ΔT, Ts+3×Δt) in the pulse position digitalizing units 12-1 to 12-4.

Therefore, effects similar to the embodiment can be obtained by the A/D converter of Reference Example 2 as well. In the A/D converter of Reference Example 2, however, it is necessary to separately provide a circuit for generating sampling clocks CK1 to CK4 determining the operation timings of the pulse position digitalizing units 12-1 to 12-4 using the reference clock CK0. Further, it is necessary to set the arrangement of the circuits with a high precision so that the sampling clocks CK1 to CK4 generated are delayed by different times and input to the pulse position digitalizing units 12-1 to 12-4, so there are the problems that the circuit configuration becomes more complicated than the embodiment and the design becomes difficult.

Figure 13:
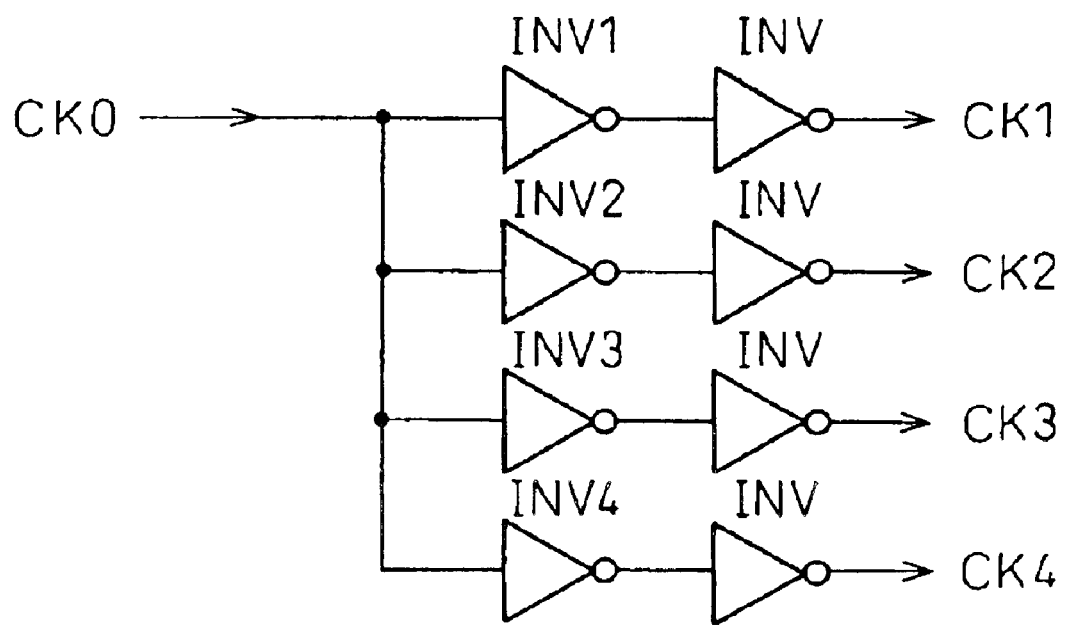
FIG. 13 is an explanatory view of an example of the configuration of a sampling clock generation circuit used for generating sampling clocks in the A/D converter of the reference example.

Note that the circuit for generating the sampling clocks CK1 to CK4 from the reference clock CK0 may, for example as shown in FIG. 13, be configured so as to generate them by passing the reference clock CK0 through inverters INV1 to INV4 with different inversion timings in the same way as the above embodiment, but in this case as well, it is preferable to provide buffers comprised of inverters INV etc. of the same characteristics at the output sides of the inverters INV1 to INV4. In this case as well, however, the drive capability has to be changed in accordance with need. That is, the switching level is generally set, but the sizes of the two p-channel and n-channel transistors are increased in accordance with the conditions (drive load).

While the invention has been described with reference to specific embodiments chosen for purpose of illustration, it should be apparent that numerous modifications could be made thereto by those skilled in the art without departing from the basic concept and scope of the invention.

What is claimed is:

1. An A/D conversion method comprising:
   modulating by an analog input signal a delay time of delay units in a pulse delay circuit comprised of a plurality of series-connected delay units outputting a pulse signal with a delay;
   inputting a pulse signal to said pulse delay circuit so as to propagate the pulse signal through said pulse delay circuit,
   latching output signals from the delay units forming said pulse delay circuit at predetermined timings, and
   generating digital data expressing reached positions of the pulse signal in said pulse delay circuit based on the levels of the latched signals so as to digitalize said analog input signal, characterized by
   latching the output signals from the delay units forming said pulse delay circuit and generating said digital data simultaneously using a plurality of pulse position digitalizing means,
   shifting the input timings of the output signals from the delay units by a time shorter than a delay time of said delay units for each of the pulse position digitalizing means, and
   adding digital data obtained by the pulse position digitalizing means.

2. An A/D conversion method as set forth in claim 1, further comprising setting the shift of the input timings of said output signals for each of the pulse position digitalizing means to a time (Td/m) obtained by dividing the delay time (Td) of said delay units by the number (m) of the pulse position digitalizing means.

3. An A/D conversion method as set forth in claim 1, further comprising setting the inversion levels of inverters provided on input paths of said output signals from said delay units to said pulse position digitalizing means to levels different for each of the pulse position digitalizing means so as to shift the input timings of said output signals to the pulse position digitalizing means.

4. An A/D conversion method as set forth in claim 3, further comprising making the drive voltage of said inverters said analog input voltage.

5. An A/D conversion method as set forth in claim 3, further comprising providing buffers at output sides of said inverters.

6. An A/D conversion method as set forth in claim 1, wherein the pulse position digitalizing means are operated using a common sampling clock.

7. An A/D conversion method as set forth in claim 6, further comprising:
   repeatedly operating the pulse position digitalizing means in synchronization with said sampling clock,
   outputting as the latest digital data a difference between current digital data and past digital data obtained in synchronization with said sampling clock from a specific pulse position digitalizing means among said plurality of pulse position digitalizing means, and
   outputting as the latest digital data a difference between current digital data obtained in synchronization with said sampling clock from another pulse position digitalizing means and past digital data obtained in synchronization with said sampling clock in said specific pulse position digitalizing means.

8. An A/D conversion method as set forth in claim 7, further comprising:
   using a pulse circulation circuit for circulating said pulse signal by using as said pulse delay circuit said delay units connected in a ring,
   counting the number of times of circulation of the pulse signal in said pulse circulation circuit after the input of the pulse signal to said pulse circulation circuit by a circulation counter, and
   in each pulse position digitalizing means, digitalizing the pulse signal in said pulse circulation circuit in synchronization with said sampling clock to generate digital data having digital data obtained by said digitalization as lower bit data and having the number of times of circulation of said pulse signal counted by said circulation counter as higher bit data.

9. An A/D converter for converting an analog input signal to digital data, provided with:
   a pulse delay circuit comprised of a plurality of series-connected delay units outputting a pulse signal delayed by a delay time corresponding to a voltage level of said analog input signal;
   m number of pulse position digitalizing means latching output signals from the delay units forming said pulse delay circuit at predetermined timings after a pulse signal is input to said pulse delay circuit and generating digital data expressing reached positions of the pulse signal in said pulse delay circuit based on the levels of the latched signals;
   a delay means for shifting the input timings of the output signals from said delay units by a time shorter than the delay time of said delay units for each of the pulse position digitalizing means, and
   an adding means for adding digital data obtained by the pulse position digitalizing means and outputting the result as digital data expressing said analog input signal.

10. An A/D converter as set forth in claim 9, wherein said delay means delays the output signals so that the input timings of said output signals to said pulse position digitalizing means are shifted by exactly the amount of a time (Td/m) obtained by dividing the delay time (Td) of said delay units by the number (m) of the pulse position digitalizing means.

11. An A/D converter as set forth in claim 9, wherein said delay means is comprised of inverters provided on input paths of said output signals from said delay units forming said pulse delay circuit to said pulse position digitalizing means and having inversion levels set to levels different for each of the pulse position digitalizing means.

12. An A/D converter as set forth in claim 11, wherein said inverters operate using said analog input voltage as their drive voltage.

13. An A/D converter set forth in claim 11, provided with buffers at output sides of said inverters.

14. An A/D converter as set forth in claim 9, wherein said pulse position digitalizing means operate by receiving a common sampling clock.

15. An A/D converter as set forth in claim 14, wherein:

a specific pulse position digitalizing means in said plurality of pulse position digitalizing means outputs a difference between current digital data and past digital data generated in synchronization with said sampling clock to said adding means as digital data expressing the result of A/D conversion, and another pulse position digitalizing means outputs a difference between current digital data generated in synchronization with said sampling clock and past digital data generated in synchronization with said sampling clock in said specific pulse position digitalizing means to said adding means as digital data expressing the result of A/D conversion.

16. An A/D converter as set forth in claim 15, comprising said pulse delay circuit by a pulse circulation circuit for circulating said pulse signal by connecting said delay units in a ring, providing a circulation counter for counting the number of times of circulation of the pulse signal in said pulse circulation circuit, and configuring said pulse position digitalizing means so as to digitalize the pulse signal in said pulse circulation circuit in synchronization with said sampling clock to generate digital data having digital data obtained by said digitalization as lower bit data and having the number of times of circulation of said pulse signal counted by said circulation counter as higher bit data.

* * * * *